United States Patent
Kang

(10) Patent No.: US 7,471,578 B2
(45) Date of Patent: *Dec. 30, 2008

(54) INTERNAL VOLTAGE GENERATION CONTROL CIRCUIT AND INTERNAL VOLTAGE GENERATION CIRCUIT USING THE SAME

(75) Inventor: Sang Hee Kang, Icheon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 11/739,684

(22) Filed: Apr. 24, 2007

(65) Prior Publication Data

US 2007/0201284 A1   Aug. 30, 2007

Related U.S. Application Data

(63) Continuation of application No. 11/155,420, filed on Jun. 17, 2005, now Pat. No. 7,227,794.

(30) Foreign Application Priority Data

Jan. 17, 2005   (KR) ............................ 2005-0004054

(51) Int. Cl.
  *G11C 7/00*   (2006.01)
(52) U.S. Cl. .................. 365/193; 365/189.05; 365/194; 365/226; 365/203; 365/230.08
(58) Field of Classification Search ................. 365/193, 365/189.05, 194, 226, 203, 230.08
  See application file for complete search history.

(56) References Cited

U.S. PATENT DOCUMENTS

| 5,942,933 A | 8/1999 | Yang |
| 6,531,914 B2 | 3/2003 | Kawakubo |
| 6,636,443 B2 * | 10/2003 | Kang .................. 365/189.05 |
| 6,826,104 B2 * | 11/2004 | Kawaguchi et al. ......... 365/222 |

(Continued)

FOREIGN PATENT DOCUMENTS

JP   02000195257   7/2000

*Primary Examiner*—Viet Q Nguyen
(74) *Attorney, Agent, or Firm*—Marshall, Gerstein & Borun LLP

(57) ABSTRACT

Disclosed herein are an internal voltage generation control circuit and an internal voltage generation circuit using the same. The internal voltage generation control circuit comprises a row active controller for enabling a first internal voltage generation control signal when a row active signal is enabled upon input of an active command and then disabling the first internal voltage generation control signal after the lapse of a first predetermined delay time if an RAS activation guarantee signal is enabled at a RAS active time after the first internal voltage generation control signal is enabled, an input/output controller for enabling a second internal voltage generation control signal when the row active signal and at least one of a data input signal and a data output signal are enabled and then disabling the second internal voltage generation control signal after the lapse of a second predetermined delay time if a row precharge signal is enabled or if the data input signal and data output signal are disabled, and a row precharge controller for enabling a third internal voltage generation control signal for a third predetermined delay time if the row precharge signal is enabled.

15 Claims, 5 Drawing Sheets

U.S. PATENT DOCUMENTS

| | | | |
|---|---|---|---|
| 7,092,305 B2* | 8/2006 | Watanabe et al. | 365/222 |
| 7,102,938 B2* | 9/2006 | Kang et al. | 365/193 |
| 7,120,078 B2* | 10/2006 | Kawaguchi et al. | 365/222 |
| 7,145,827 B2* | 12/2006 | Kwak et al. | 365/222 |
| 7,227,794 B2* | 6/2007 | Kang | 365/193 |
| 2004/0221099 A1* | 11/2004 | Kim | 711/106 |
| 2005/0036378 A1* | 2/2005 | Kawaguchi et al. | 365/202 |
| 2006/0158161 A1* | 7/2006 | Kang | 323/234 |
| 2007/0201284 A1* | 8/2007 | Kang | 365/189.09 |

* cited by examiner

INTERNAL VOLTAGE GENERATION CONTROL CIRCUIT AND INTERNAL VOLTAGE GENERATION CIRCUIT USING THE SAME

This patent is a continuation of U.S. Ser. No. 11/155,420 filed Jun. 17, 2005, the disclosure of which is hereby expressly incorporated for all purposes.

BACKGROUND OF THE INVENTION

1. Field of the Invention

The present invention relates to an internal voltage generation control circuit and an internal voltage generation circuit using the same, and more particularly to a circuit for generating an internal voltage for an active operation of a semiconductor device and a circuit for controlling the generation of the internal voltage, wherein the internal voltage is supplied only in periods in which actual operations are performed after the active operation of the semiconductor device.

2. Description of the Related Art

Recently, the operating frequencies of semiconductor memory devices, such as a dynamic random access memory (DRAM), and the like, etc., have become higher for high-speed operations of the memory devices, so the reduction in current consumption has been highlighted as an issue. In particular, the DRAM and the like, etc. have been widely applied to mobile terminals, etc. as well as being used as the main storage unit of computers. In this regard, the reduction in current consumption has become an essential requirement in designing semiconductor devices such as a DRAM, etc. However, a conventional circuit for generating an internal voltage for an active operation of a semiconductor device has the disadvantage of continuously generating and supplying an internal voltage not only in periods in which actual operations, such as an input operation, an output operation or, a row precharge operation, etc., and are performed after the active operation, but also in other periods in which the actual operations are not performed after the active operation, resulting in unnecessary current consumption, thus reducing power efficiency.

FIG. 1 is a block diagram showing the configuration of a conventional internal voltage generation circuit, FIG. 2 is a waveform diagram illustrating the operation of the conventional internal voltage generation circuit, and FIG. 3 is a circuit diagram of an internal voltage generator in the conventional internal voltage generation circuit. The above problem with the conventional internal voltage generation circuit will hereinafter be described in detail with reference to these drawings.

As shown in FIG. 1, the conventional internal voltage generation circuit comprises a signal generator 110 for receiving an external command signal CMD and a bank address signal BA and outputting a row active signal RACTP and a row precharge signal RPCGBP, an internal voltage generation control circuit 120 for receiving the row active signal RACTP and row precharge signal RPCGBP from the signal generator 110 and outputting an internal voltage generation control signal VINT_ACT, and an internal voltage generator 130 for generating an internal voltage VINT in response to the internal voltage generation control signal VINT_ACT.

A description will hereinafter be given of the operation of the conventional internal voltage generation circuit with the above-mentioned configuration. As shown in FIG. 2, when a bank address signal BA, a row address signal RA and an active command signal ACT are inputted synchronously with a rising edge of a clock CLK, a row active signal RACTP corresponding to a bank addressed by the bank address signal BA is outputted from the signal generator 110. Then, the internal voltage generation control circuit 120 outputs an internal voltage generation control signal VINT_ACT which makes a low to high level transition. This internal voltage generation control signal VINT_ACT is inputted to the internal voltage generator 130 shown in FIG. 3.

Accordingly, in FIG. 3, an NMOS transistor N6 is turned off and an NMOS transistor N3 is turned on, so that the internal voltage generator 130 is enabled. At this time, if a reference voltage REF_VINT is higher than a divided voltage Vx of the internal voltage VINT, an NMOS transistor N1 is turned on to pull a node A1 down to a low level, so as to turn a PMOS transistor P1 on. As the PMOS transistor P1 is turned on, the potential of a node B1 rises to a high level, thereby causing an NMOS transistor N5 to be turned on, thus pulling a node C1 down to a low level. As a result, a PMOS transistor P8 is turned on to supply an external voltage VDD to an output node D1, so that the internal voltage VINT rises.

On the other hand, if the reference voltage REF_VINT is lower than the divided voltage Vx of the internal voltage VINT, an NMOS transistor N2 is turned on to pull a node E1 down to a low level, so as to turn a PMOS transistor P6 on. As the PMOS transistor P6 is turned on, the potential of the node C1 rises to a high level, thereby causing the PMOS transistor P8 to be turned off. As a result, the external voltage VDD is not supplied to the output node D1, so that the internal voltage VINT falls or is maintained as it is.

Thereafter, as shown in FIG. 2, if a bank address signal BA and a precharge command signal PCG are enabled, then a row precharge signal RPCGBP is outputted from the signal generator 110. Then, the internal voltage generation control signal VINT_ACT from the internal voltage generation control circuit 120 is disabled from high to low in level after a delay time Td. Hence, the NMOS transistor N6 in FIG. 3 is turned on thereby causing the internal voltage generator 130 to be disabled.

As stated above, the conventional internal voltage generation circuit and internal voltage generation control circuit are adapted to, until the precharge command PCG is inputted after the active operation, continuously enablinge the internal voltage generator 130 to supply the internal voltage VINT. As a result, the conventional internal voltage generation circuit continuously generates and supplies the internal voltage not only in periods in which actual operations, such as an input operation, an output operation, a row precharge operation, and the like etc., are performed after the active operation, but also in other periods in which the actual operations are not performed after the active operation, resulting in unnecessary consumption of a large amount of current, thus reducing power efficiency.

SUMMARY OF THE INVENTION

Therefore, the present invention has been made in view of the above problems, and it is an object of the present invention to provide an internal voltage generation control circuit and an internal voltage generation circuit using the same, wherein an internal voltage is supplied only in periods in which actual operations, such as a row address strobe active operation, an input operation, an output operation, a row precharge operation, etc., are performed after an active operation of a semiconductor device, and an internal voltage generation control signal is disabled in other periods in which the actual operations are not performed after the active operation of the semiconductor device, thereby reducing current consumption of the semiconductor device and raising power efficiency.

In accordance with an aspect of the present invention, the above and other objects can be accomplished by the provision of an internal voltage generation control circuit comprising a row active controller for outputting a first internal voltage generation control signal in response to a row active signal and a row address strobe (RAS) activation guarantee signal, the row active controller enabling the first internal voltage generation control signal when the row active signal is enabled upon input of an active command and then disabling the first internal voltage generation control signal after the lapse of a first predetermined delay time if the RAS activation guarantee signal is enabled at a RAS active time after the first internal voltage generation control signal is enabled; an input/output controller for outputting a second internal voltage generation control signal in response to a data input signal, a data output signal, the row active signal and a row precharge signal, the input/output controller enabling the second internal voltage generation control signal when the row active signal and at least one of the data input signal and data output signal are enabled and then disabling the second internal voltage generation control signal after the lapse of a second predetermined delay time if the row precharge signal is enabled or if the data input signal and data output signal are disabled, and a row precharge controller for outputting a third internal voltage generation control signal in response to the row precharge signal, the row precharge controller enabling the third internal voltage generation control signal for a third predetermined delay time if the row precharge signal is enabled.

In accordance with another aspect of the present invention, there is provided an internal voltage generation control circuit comprising a row active controller for outputting a first internal voltage generation control signal in response to a row active signal and a row address strobe (RAS) activation guarantee signal, the row active controller enabling the first internal voltage generation control signal when the row active signal is enabled upon input of an active command and then disabling the first internal voltage generation control signal after the lapse of a first predetermined delay time if the RAS activation guarantee signal is enabled at a RAS active time after the first internal voltage generation control signal is enabled; and an input/output controller for outputting a second internal voltage generation control signal in response to a data input signal, a data output signal, the row active signal and a row precharge signal, the input/output controller enabling the second internal voltage generation control signal when the row active signal and at least one of the data input signal and data output signal are enabled and then disabling the second internal voltage generation control signal after the lapse of a second predetermined delay time if the row precharge signal is enabled or if the data input signal and data output signal are disabled.

In accordance with yet another aspect of the present invention, there is provided an internal voltage generation circuit comprising a signal generator for receiving a plurality of control signals and outputting a plurality of signals including a row active signal, a row address strobe (RAS) activation guarantee signal, a data input signal, a data output signal and a row precharge signal; an internal voltage generation control circuit for receiving the plurality of signals from the signal generator and outputting a target internal voltage generation control signal; and an internal voltage generator for generating an internal voltage in response to the target internal voltage generation control signal, wherein the internal voltage generation control circuit includes a row active controller for outputting a first internal voltage generation control signal in response to the row active signal and RAS activation guarantee signal, the row active controller enabling the first internal voltage generation control signal when the row active signal is enabled upon input of an active command and then disabling the first internal voltage generation control signal after the lapse of a first predetermined delay time if the RAS activation guarantee signal is enabled at an RAS active time after the first internal voltage generation control signal is enabled; an input/output controller for outputting a second internal voltage generation control signal in response to the data input signal, a data output signal, a row active signal and a row precharge signal, the input/output controller enabling the second internal voltage generation control signal when the row active signal and at least one of the data input signal and data output signal are enabled and then disabling the second internal voltage generation control signal after the lapse of a second predetermined delay time if the row precharge signal is enabled or if the data input signal and data output signal are disabled, and a row precharge controller for outputting a third internal voltage generation control signal in response to the row precharge signal, the row precharge controller enabling the third internal voltage generation control signal for a third predetermined delay time if the row precharge signal is enabled.

Preferably, the internal voltage generation control circuit further includes a logic circuit for performing a logical operation with respect to the first to third internal voltage generation control signals to output the target internal voltage generation control signal.

The logic circuit may perform a logical sum operation with respect to the first to third internal voltage generation control signals.

Preferably, the row active controller includes a pull-down device for pulling a control node down in response to the row active signal; a pull-up device for pulling the control node up in response to the RAS activation guarantee signal; a latch for latching a signal at the control node; and a delay operated in response to an output signal from the latch, the delay enabling and outputting the first internal voltage generation control signal when the row active signal is enabled and then disabling and outputting the first internal voltage generation control signal after the lapse of the first predetermined delay time if the RAS activation guarantee signal is enabled.

Preferably, the delay includes a delay element for delaying the output signal from the latch for the first predetermined delay time; and a logic unit for performing a logical operation with respect to the output signal from the latch and an output signal from the delay element to output the first internal voltage generation control signal.

Preferably the logic unit includes a NAND gate for performing a NAND operation with respect to the output signal from the latch and the output signal from the delay element.

Preferably, the input/output controller includes a first logic unit for performing a logical operation with respect to the data input signal and the data output signal; a pull-down device for pulling a control node down in response to the row active signal; a pull-down device for pulling the control node up in response to the row precharge signal; a latch for latching a signal at the control node; a second logic unit for performing a logical operation with respect to an output signal from the first logic unit and an output signal from the latch; and a delay for enabling the second internal voltage generation control signal when an output signal from the second logic unit is enabled and disabling the second internal voltage generation control signal after the lapse of the second predetermined delay time if the output signal from the second logic unit is disabled.

Preferably, the delay of the input/output controller includes a buffer for buffering the output signal from the second logic unit; a delay element for delaying an output signal from the buffer for the second predetermined delay time; and a third logic unit for performing a logical operation with respect to the output signal from the buffer and an output signal from the delay element to output the second internal voltage generation control signal.

The buffer may be an inverter.

The third logic unit may be a NAND gate for performing a NAND operation with respect to the output signal from the buffer and the output signal from the delay element.

The first logic unit may perform a logical sum operation with respect to the data input signal and the data output signal.

Preferably, the latch includes two inverters latched to each other.

The second logic unit may perform a logical product operation with respect to the output signal from the first logic unit and the output signal from the latch.

Preferably, the row precharge controller includes a latch including first and second NAND gates latched to each other, the first NAND gate receiving the row precharge signal at its one input terminal; and a delay buffer for delaying buffering an output signal from the latch and supplying the resulting signal to one input terminal of the second NAND gate.

Preferably, the first NAND gate has an output terminal connected to the other input terminal of the second NAND gate and the second NAND gate has an output terminal connected to the other input terminal of the first NAND gate.

The delay buffer may have an inverting-buffer and delay the output signal from the latch.

Preferably, the delay buffer includes an odd number of inverters.

The first predetermined delay time may be a time required for an internal voltage to be stabilized after the RAS activation guarantee signal is enabled.

The second predetermined delay time may be a time required for completion of data input or data output.

Preferably, the third predetermined delay time includes at least a a set time from the start of a row precharge operation until the completion of the row precharge operation.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the annexed drawings. It should be noted herein that these embodiments are only for illustrative purposes and the protection scope of the invention is not limited thereto.

The present invention is directed to a circuit for generating an internal voltage for an active operation of a semiconductor device among internal voltage generation circuits of the semiconductor device, and a circuit for controlling the generation of the internal voltage.

Figure 4:
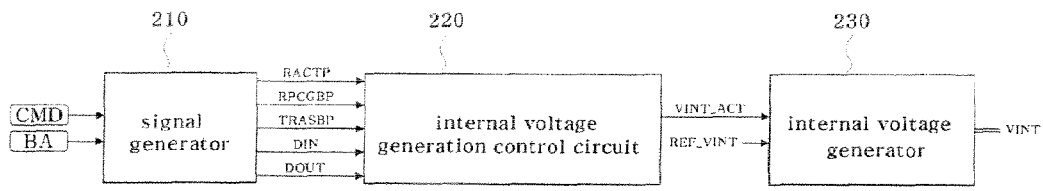
FIG. 4 is a block diagram showing the configuration of an internal voltage generation circuit according to one embodiment of the present invention.
Figure 6:
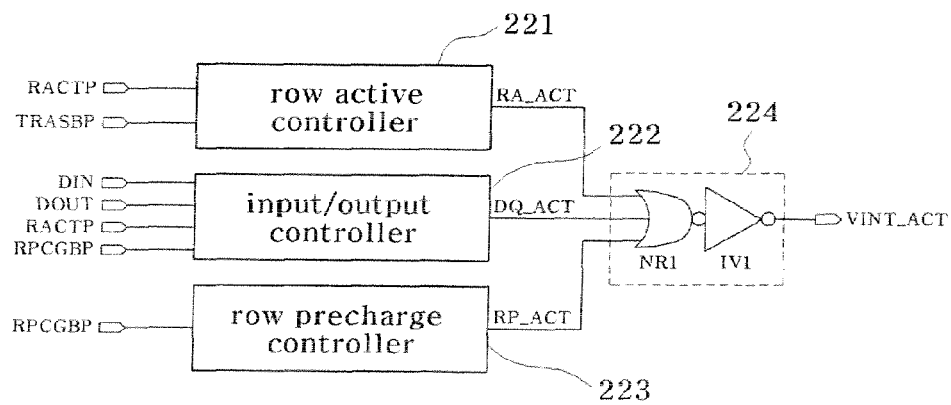
FIG. 6 is a block diagram showing the configuration of an internal voltage generation control circuit according to one embodiment of the present invention.

FIG. 4 is a block diagram showing the configuration of an internal voltage generation circuit according to one embodiment of the present invention and FIG. 6 is a block diagram showing the configuration of an internal voltage generation control circuit according to one embodiment of the present invention.

As shown in FIG. 4, the internal voltage generation circuit according to one embodiment of the present invention comprises a signal generator 210 for receiving a plurality of signals including an external command signal CMD and a bank address signal BA and outputting a plurality of signals including a row active signal RACTP, a row address strobe (RAS) activation guarantee signal TRASBP, a data input signal DIN, a data output signal DOUT and a row precharge signal RPCGBP, an internal voltage generation control circuit 220 for receiving the plurality of signals from the signal generator 210 and outputting an internal voltage generation control signal VINT_ACT, and an internal voltage generator 230 for generating an internal voltage VINT in response to the internal voltage generation control signal VINT_ACT.

The internal voltage generation control circuit 220 includes, as shown in FIG. 6, a row active controller 221 for outputting a first internal voltage generation control signal RA_ACT in response to the row active signal RACTP and RAS activation guarantee signal TRASBP. The row active controller 221 is adapted to enable the first internal voltage generation control signal RA_ACT when the row active signal RACTP is enabled upon input of an active command ACT and then disables the first internal voltage generation control signal RA_ACT after the lapse of a delay time tD if the RAS activation guarantee signal TRASBP is enabled at a RAS active time tRAS after the first internal voltage generation control signal RA_ACT is enabled. The internal voltage generation control circuit 220 further includes an input/output controller 222 for outputting a second internal voltage generation control signal DQ_ACT in response to the data input signal DIN, data output signal DOUT, row active signal RACTP and row precharge signal RPCGBP. The input/output controller 222 is adapted to enable the second internal voltage generation control signal DQ_ACT when the row active signal RACTP and at least one of the data input signal DIN and data output signal DOUT are enabled and then disable the second internal voltage generation control signal DQ_ACT after the lapse of a delay time tDQ if the row precharge signal RPCGBP is enabled or if the data input signal DIN and data output signal DOUT are disabled. The internal voltage generation control circuit 220 further includes a row precharge controller 223 for outputting a third internal voltage generation control signal RP_ACT in response to the row precharge signal RPCGBP. The row precharge controller 223 is adapted to enable the third internal voltage generation control signal RP_ACT for a delay time tDRP if the row precharge signal RPCGBP is enabled.

In the present embodiment, the internal voltage generation control circuit 220 further includes a logic circuit 224 for performing a logical sum operation with respect to the first to third internal voltage generation control signals RA_ACT, DQ_ACT and RP_ACT to output the internal voltage generation control signal VINT_ACT.

Figure 5:
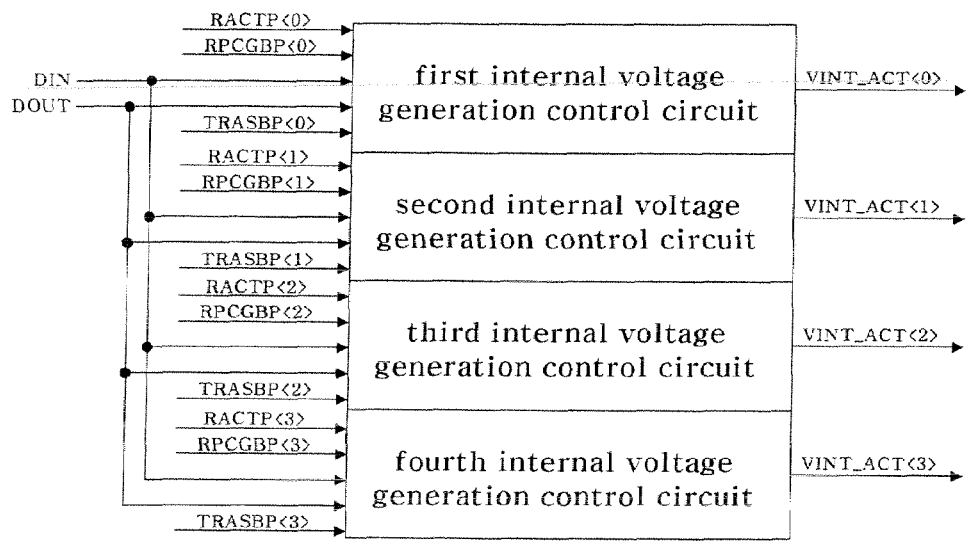
FIG. 5 is a view illustrating a concept of generating an internal volatile generation control signal in a semiconductor memory device having a plurality of banks.

As in the first to fourth internal voltage generation control circuits shown in FIG. 5, the internal voltage generation control circuit 220 with the above-described configuration is installed independently for each bank to supply a separate internal voltage generation control signal VINT_ACT<0>, VINT_ACT<1>, VINT_ACT<2> or VINT_ACT<3> for each bank so that the internal voltage can be generated.

The operation of the internal voltage generation circuit with the above-stated configuration according to one embodiment of the present invention will hereinafter be described in detail with reference to FIGS. 4 to 6.

As shown in FIG. 4, the signal generator 210 receives a plurality of signals including an external command signal CMD and a bank address signal BA and outputs a plurality of signals including a row active signal RACTP, a RAS activation guarantee signal TRASBP, a data input signal DIN, a data output signal DOUT and a row precharge signal RPCGBP. Then, the internal voltage generation control circuit 220 receives the plurality of signals from the signal generator 210 and outputs an internal voltage generation control signal VINT_ACT. At this time, in the present embodiment, the internal voltage generation control circuit 220 is adapted to output the internal voltage generation control signal VINT_ACT such that an internal voltage is supplied only in periods in which actual operations, such as a RAS active operation, an input operation, an output operation, a row precharge operation, etc., are performed. To this end, the internal voltage generation control circuit 220 includes the row active controller 221, input/output controller 222 and row precharge controller 223. A detailed description will hereinafter be given of each of the row active controller 221, input output controller 222 and row precharge controller 223.

The row active controller 221 outputs a first internal voltage generation control signal RA_ACT in response to the row active signal RACTP and RAS activation guarantee signal TRASBP, as will hereinafter be described.

Figure 7:
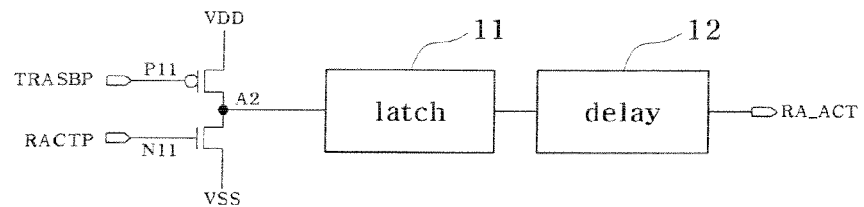
FIG. 7 is a view showing the configuration of a row active controller in the internal voltage generation control circuit according to one embodiment of the present invention.
Figure 8:
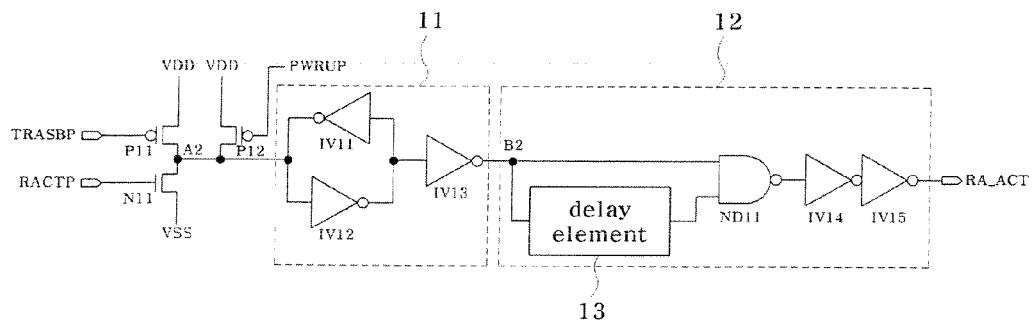
FIG. 8 is a detailed diagram of the row active controller of FIG. 7.

FIGS. 7 and 8 show the configuration of the row active controller 221. As shown in these drawings, the row active controller 221 includes an NMOS transistor N11 for pulling a node A2 down in response to the row active signal RACTP, a PMOS transistor P11 for pulling the node A2 up in response to the RAS activation guarantee signal TRASBP, a latch 11 for latching a signal at the node A2, and a delay 12 operated in response to an output signal from the latch 11. The delay 12 is adapted to enable and output the first internal voltage generation control signal RA_ACT with no delay when the row active signal RACTP is enabled and then disables and outputs the first internal voltage generation control signal RA_ACT after the lapse of a delay time tD if the RAS activation guarantee signal TRASBP is enabled. Here, the delay 12 includes a delay element 13 for delaying the output signal from the latch 11 for the delay time tD, and a NAND gate ND11 for NANDing the output signal from the latch 11 and an output signal from the delay element 13 to output the first internal voltage generation control signal RA_ACT.

Figure 15:
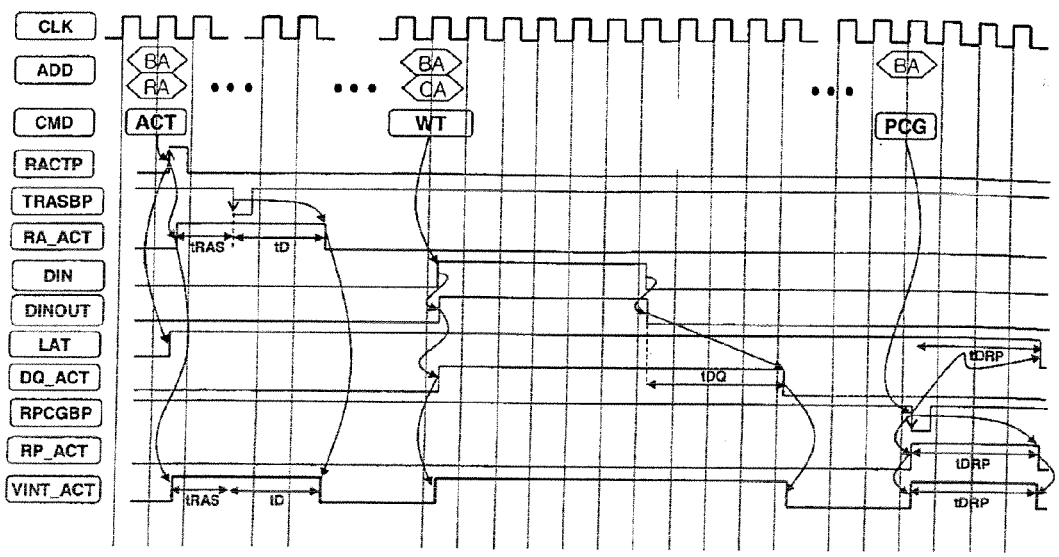
FIG. 15 is a waveform diagram illustrating the entire operation of the internal voltage generation control circuit according to one embodiment of the present invention.

As shown in FIG. 15, when a bank address signal BA, a row address signal RA and an active command signal ACT are inputted in synchronously with a rising edge of a clock CLK, the row active signal RACTP from the signal generator 210 is enabled to a high level. As a result, the NMOS transistor N11 is turned on and the node A2 is thus pulled down to a low level. The latch 11 latches the low level signal at the node A2 and outputs the latched signal to a node B2. At the time that the signal at the node B2 makes a high to low level transition in this manner, the output of the NAND gate ND11 instantaneously becomes high in level irrespective of the output of the delay element 13, so that the first internal voltage generation control signal RA_ACT is enabled high in level through inverters IV14 and IV15.

Thereafter, the RAS activation guarantee signal TRASBP is enabled as shown in FIG. 15. Here, the RAS activation guarantee signal TRASBP is a signal to guarantee a RAS active time tRAS. That is, in order to guarantee that the first internal voltage generation control signal RA_ACT is maintained in the enabled state for the RAS active time tRAS, the RAS activation guarantee signal TRASBP is enabled at the RAS active time tRAS after the first internal voltage generation control signal RA_ACT is enabled. The RAS active time tRAS is a time taken to activate an associated word line to fully re-store data in cells of the word line.

In FIG. 8, when the RAS activation guarantee signal TRASBP is enabled, the PMOS transistor P11 is turned on and the node A2 is thus pulled up to a high level. The latch 11 latches the high level signal at the node A2 and outputs the latched signal to the node B2. At the time that the signal at the node B2 makes a low to high level transition in this manner, a signal at one input terminal of the NAND gate ND11 instantaneously becomes high in level, but a signal at the other input terminal of the NAND gate ND11, or the output signal from the delay element 13, is continuously maintained at the previous level, or low level, for the delay time tD. As a result, the output signal from the NAND gate ND11 and the first internal voltage generation control signal RA_ACT are continuously maintained in the enabled state, or a high level state, for the delay time tD. After that, when the delay time tD has elapsed, the two input signals to the NAND gate ND11 become high in level, thereby causing the output signal from the NAND gate ND11 and the first internal voltage generation control signal RA_ACT to be disabled low in level. The delay time tD is a time required for the internal voltage VINT to be stabilized after the RAS activation guarantee signal TRASBP is enabled. This delay time tD can be set properly according to system environments.

Therefore, as shown in FIG. 15, when the row active signal RACTP from the signal generator 210 is enabled to a high level, the first internal voltage generation control signal RA_ACT is enabled to a high level so that the internal voltage VINT can be generated. Thereafter, when the RAS activation guarantee signal TRASBP is enabled after the lapse of the RAS active time tRAS, the first internal voltage generation control signal RA_ACT is maintained in the enabled state for the delay time tD and then disabled to a low level so that the internal voltage VINT cannot be generated.

Next, the input/output controller 222 outputs a second internal voltage generation control signal DQ_ACT in response to the data input signal DIN, data output signal DOUT, row active signal RACTP and row precharge signal RPCGBP, as will hereinafter be described.

Figure 9:
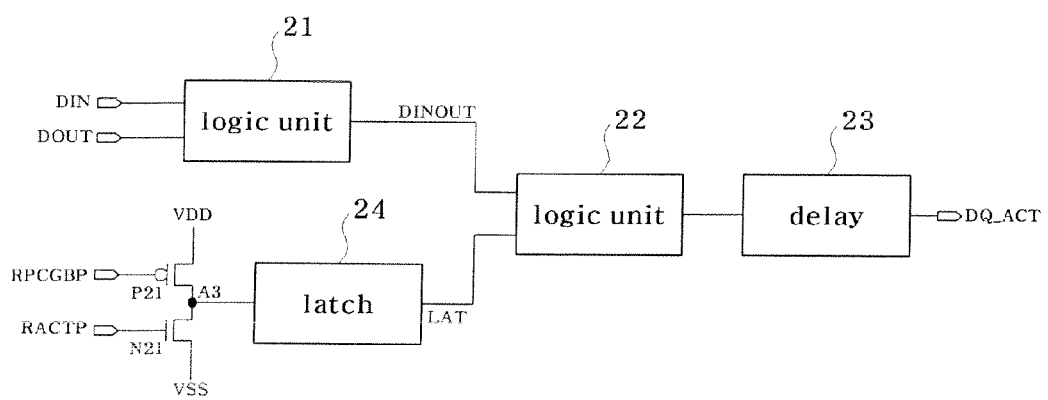
FIG. 9 is a view showing the configuration of an input/output controller in the internal voltage generation control circuit according to one embodiment of the present invention.
Figure 10:
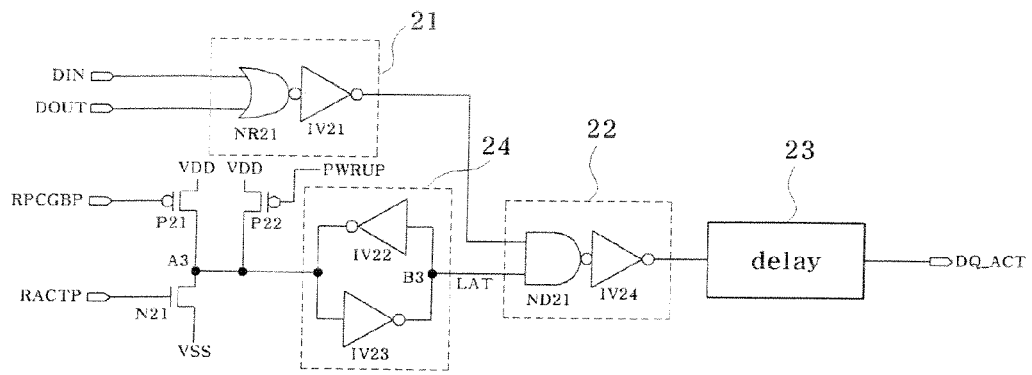
FIG. 10 is a detailed diagram of the input/output controller of FIG. 9.

FIGS. 9 and 10 show the configuration of the input/output controller 222. As shown in these drawings, the input/output controller 222 includes a logic unit 21 for performing a logical sum operation with respect to the data input signal DIN and the data output signal DOUT, an NMOS transistor N21 for pulling a node A3 down in response to the row active signal RACTP, a PMOS transistor P21 for pulling the node A3 up in response to the row precharge signal RPCGBP, a latch 24 for latching a signal at the node A3, a logic unit 22 for performing a logical product operation with respect to an output signal DINOUT from the logic unit 21 and an output signal LAT from the latch 24, and a delay 23 for enabling the second internal voltage generation control signal DQ_ACT when an output signal from the logic unit 22 is enabled and disabling the second internal voltage generation control signal DQ_ACT after the lapse of a delay time tDQ if the output signal from the logic unit 22 is disabled.

Figure 11:
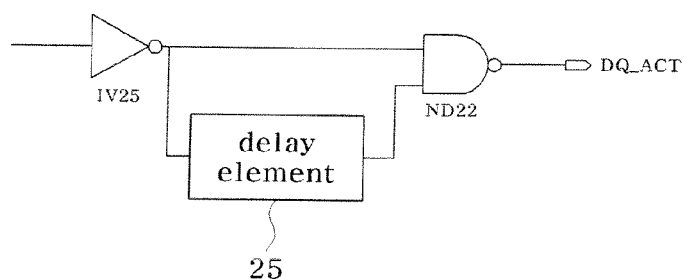
FIG. 11 is a detailed diagram of a delay in the input/output controller of FIG. 10.

The delay 23 includes, as shown in FIG. 11, an inverter IV25 for inverting-buffering the output signal from the logic unit 22, a delay element 25 for delaying an output signal from the inverter IV25 for the delay time tDQ, and a NAND gate ND22 for NANDing the output signal from the inverter IV25 and an output signal from the delay element 25 to output the second internal voltage generation control signal DQ_ACT. The latch 24 consists of two inverters IV22 and IV23 latched to each other. The row precharge signal RPCGBP is a signal that is enabled to a low level when a precharge command PCG is inputted, as shown in FIG. 15.

Figure 12:
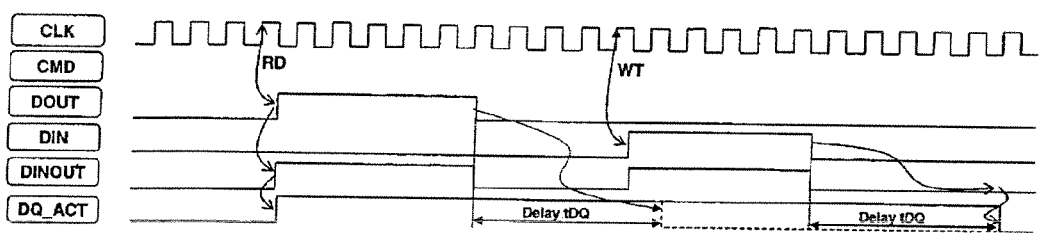
FIG. 12 is a waveform diagram illustrating in detail the operation of the input/output controller of FIG. 10.

First, as shown in FIG. 15, when the row active signal RACTP from the signal generator 210 is enabled to a high level, the NMOS transistor N21 is turned on and the node A3 is thus pulled down to a low level. The latch 24 latches the low level signal at the node A3 and outputs the latched signal to a node B3. In this state, as shown in FIG. 12, when the data output signal DOUT is enabled by a read command RD or the data input signal DIN is enabled by a write command WT, the output signal DINOUT from the logic unit 21 becomes high in level. As a result, the logic unit 22 receives the high level signal DINOUT and the high level signal LAT and supplies a high level signal to the delay 23. Consequently, since a low level signal is inputted to one input terminal of the NAND gate ND22 in the delay 23, the second internal voltage generation control signal DQ_ACT is enabled to a high level.

Figure 1:
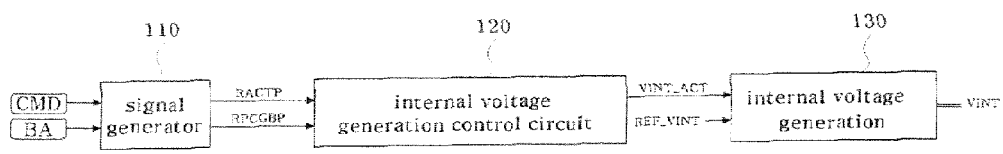
FIG. 1 is a block diagram snowing the configuration of a conventional internal voltage generation circuit.
Figure 2:
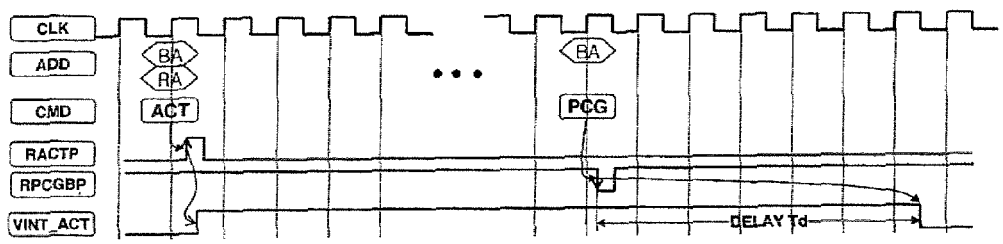
FIG. 2 is a waveform diagram illustrating the operation of the conventional internal voltage generation circuit.
Figure 3:
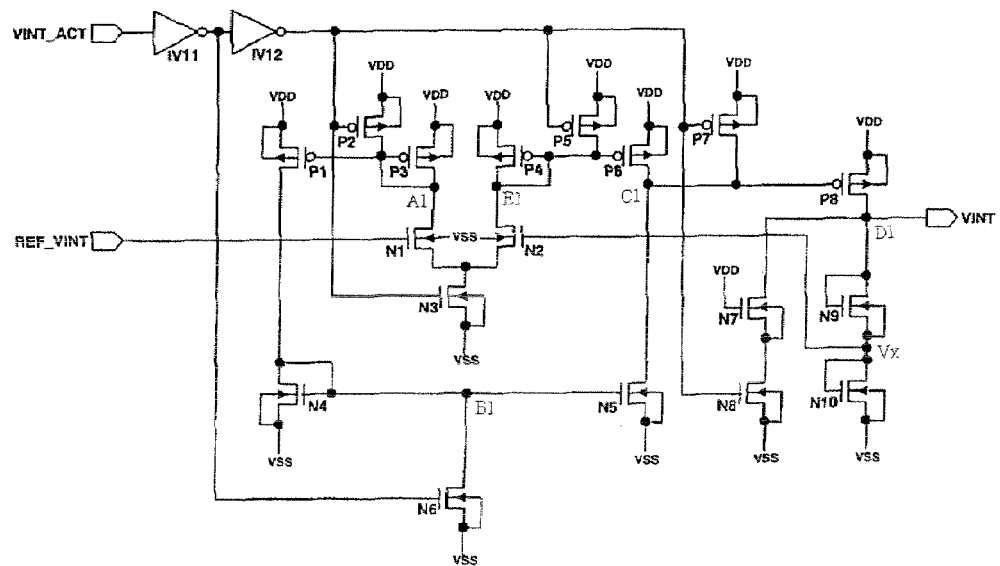
FIG. 3 is a circuit diagram of an internal voltage generator in the conventional internal voltage generation circuit.

Thereafter, when both the data output signal DOUT and data input signal DIN are disabled low in level, the signal DINOUT goes to a low in level, too, thereby causing the output signal from the logic unit 22 to go to a low in level irrespective of the state of the signal LAT. Upon receiving the low level signal from the logic unit 22, the delay 23 disables the second internal voltage generation control signal DQ_ACT to a low level after the lapse of the delay time tDQ. Namely, in FIG. 1 at the time that the input signal to the inverter IV25 goes low in level, the input signal to one input terminal of the NAND gate ND22 instantaneously goes high in level, but the signal at the other input terminal of the NAND gate ND22, or the output signal from the delay element 25, is continuously maintained at the previous level, or a low level, for the delay time tDQ. As a result, the second internal voltage generation control signal DQ_ACT from the NAND gate ND22 is continuously maintained in the previous state, or enabled state, for the delay time tDQ. After that, when the output signal from the delay element 25 also goes high in level after the lapse of the delay time tDQ, the second internal voltage generation control signal DQ_ACT is disabled to a low level.

Therefore, when both the data output signal DOUT and data input signal DIN are disabled low in level, the second internal voltage generation control signal DQ_ACT is maintained in the enabled state for the delay time tDQ and then disabled to a low level after the lapse of the delay time tDQ. Here, the delay time tDQ is a time taken to supply the internal voltage VINT for a predetermined time even after the data output signal DOUT or data input signal DIN is disabled. This delay time tDQ can be set properly according to system environments.

Thereafter, when the row precharge signal RPCGBP is enabled to a low level by a precharge command PCG as shown in FIG. 15, the PMOS transistor P21 is turned on and the node A3 is thus pulled up to a high level, thereby causing the output signal LAT from the latch 24 to go low in level. If the signal LAT becomes low in level, then the second internal voltage generation control signal DQ_ACT is maintained in the disabled state and the internal voltage generator 230 is not operated, even if the data output signal DOUT or the data input signal DIN is enabled.

For reference, FIG. 12 shows an example where the data input signal DIN is enabled before the lapse of the delay time tDQ after the data output signal DOUT is disabled to a low level. In this example, the second internal voltage generation control signal DQ_ACT is continuously maintained in the enabled state even after the data output signal DOUT is disabled to the low level, and is then disabled at the delay time tDQ after the data input signal DIN is disabled.

In this manner, only when the data input signal DIN or data output signal DOUT is enabled under the condition that the row active signal RACTP is enabled to a high level, the input/output controller 222 enables the second internal voltage veneration control signal DQ_ACT so that the internal voltage VINT can be generated.

Next, the row precharge controller 223 outputs a third internal voltage generation control signal RP_ACT in response to the row precharge signal RPCGBP, as will be hereinafter be described.

Figure 13:
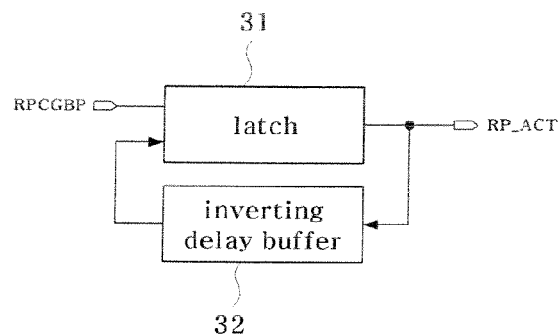
FIG. 13 is a block diagram showing the configuration of a row precharge controller in the internal voltage generation control circuit according to one embodiment of the present invention.
Figure 14:
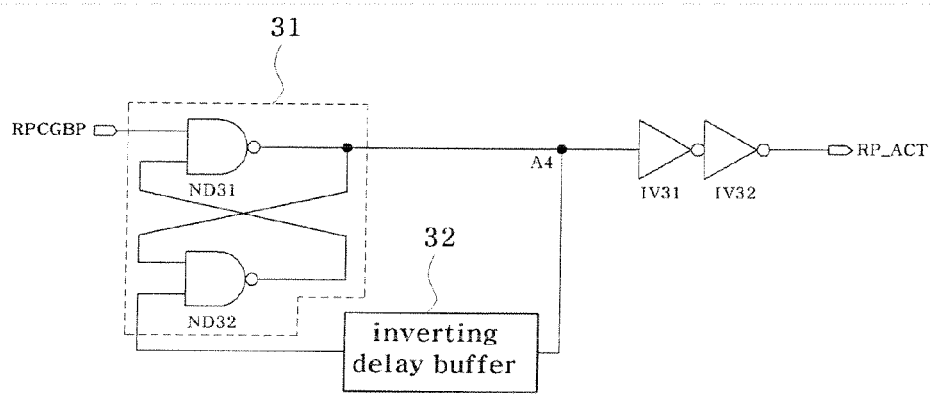
FIG. 14 is a detailed diagram of the row precharge controller of FIG. 13.

FIGS. 13 and 14 show the configuration of the row precharge controller 223 in the internal voltage generation control circuit according to one embodiment of the present invention. As shown in these drawings, the row precharge controller 223 includes a latch 31 consisting of two NAND gates ND31 and ND32 latched to each other. The NAND gate ND31 receives the row precharge signal RPCGBP at its one input terminal. The row precharge controller 223 further includes an inverting delay buffer 32 for inverting-buffering and delaying an output signal from the latch 31 and supplying the resulting signal to one input terminal of the NAND gate ND32. The inverting delay buffer 32 includes an odd number of inverters. Here, the row precharge signal RPCGBP is a signal that is enabled to a low level when the precharge command PCG is inputted, as shown in FIG. 15.

The operation of the row precharge controller 223 is performed in the following manner. As shown in FIG. 15, when the row precharge signal RPCGBP is enabled to a low level in response to the precharge command PCG inputted under the condition that the third internal voltage generation control signal RP_ACT is low in level, the output of the NAND gate ND31 becomes high in level, thus enabling the third internal voltage generation control signal RP_ACT to a high level.

The inverting delay buffer 32 acts to invert a signal at a node A4 and delay the inverted signal for a delay time tDRP. Here, the delay time tDRP includes at least a set time from the start of the row precharge operation until the completion of the row precharge operation. That is, the delay time tDRP includes at least a set time for which the row precharge operation is performed with the row precharge signal RPCGBP enabled. The delay time tDRP optionally includes a time required to operate the internal voltage generation circuit to stabilize the internal voltage after the completion of the row precharge operation.

When the delay time tDRP has elapsed after the row precharge signal RPCGBP is enabled to a low level, the output signal from the inverting delay buffer 32 makes a high to low level transition and the NAND gate ND32 thus outputs a high level signal. Meanwhile, because the row precharge signal RPCGBP is disabled to a high level within a short time after being enabled to the low level, it is in the high level state at the time that the delay time tDRP has elapsed. As a result, the two input signals to the NAND gate ND31 become high in level, thereby causing the signal at the node A4 to go low in level and the third internal voltage generation control signal RP_ACT to be disabled to a low level.

Therefore, the row precharge controller 223 outputs the third internal voltage generation control signal RP_ACT in response to the row precharge signal RPCGBP in such a manner that it enables the third internal voltage generation control signal RP_ACT for the delay time tDRP if the row precharge signal RPCGBP is enabled.

Finally, as shown in FIG. 6, the first internal voltage generation control signal RA_ACT from the row active controller 221, the second internal voltage generation control signal DQ_ACT from the input/output controller 22, and the third internal voltage generation control signal RP_ACT from the row precharge controller 223 are inputted to the logic circuit 224, which then performs a logical sum operation with respect to those signals. Accordingly, a signal obtained as a result of the logical sum operation with respect to the first internal voltage generation control signal RA_ACT, the second internal voltage generation control signal DQ_ACT and the third internal voltage generation control signal RP_ACT is outputted as the internal voltage generation control signal VINT_ACT. In conclusion, when at least one of these three signals is enabled, the internal voltage generation control signal VINT_ACT is enabled, so that the internal voltage generator 230 is normally operated to generate and supply the internal voltage VINT.

Here, the logic circuit 224 is a logic gate that performs the logical sum operation. This logic circuit 224 includes a NOR gate NR1 and an inverter IV1 as shown in FIG. 6, but may be alternatively configured in various other ways.

In brief, in the internal voltage generation control circuit and the internal voltage generation circuit using the same according to the present invention, the row active controller 221 generates the first internal voltage generation control signal RA_ACT to enable the internal voltage generator 230 for the RAS active time tRAS and delay time tD after the row active signal RACTP is enabled by the input of the active command ACT. The input/output controller 222 generates the second internal voltage generation control signal DQ_ACT to enable the internal voltage generator 230 when the data input signal DIN or data output signal DOUT is enabled under the condition that the row active signal RACTP is enabled to a high level. The row precharge controller 223 generates the third internal voltage generation control signal RP_ACT to enable the internal voltage generator 230 for the delay time tDRP if the row precharge signal RPCGBP is enabled. Therefore, in the internal voltage generation control circuit and the internal voltage generation circuit using the same according to the present invention, the internal voltage is supplied only in the periods in which the actual operations, such as the RAS active operation, input operation, output operation, row precharge operation, etc., are performed after the active operation of the semiconductor device, and the internal voltage generation control signal is disabled in other periods in which the actual operations are not performed after the active operation of the semiconductor device. It is thus possible to reduce current consumption of the semiconductor device and increase power efficiency.

Although the internal voltage generation control circuit and the internal voltage generation circuit using the same have been disclosed to include the row active controller 221, the input/output controller 222 and the row precharge controller 223, they may selectively employ only one or two of them according to various embodiments of the present invention.

As apparent from the above description, the present invention provides an internal voltage generation control circuit and an internal voltage generation circuit using the same, wherein an internal voltage is supplied only in periods in which actual operations, such as a RAS active operation, an input operation, an output operation, a row precharge operation, etc., are performed after an active operation of a semiconductor device, and an internal voltage generation control signal is disabled in other periods in which the actual operations are not performed after the active operation of the semiconductor device, thereby making it possible to reduce current consumption of the semiconductor device and raise power efficiency.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An internal voltage generation control circuit comprising:
   a row active controller for outputting a first internal voltage generation control signal in response to a row active signal and a row address strobe (RAS) activation guarantee signal; and
   an input/output controller for outputting a second internal voltage generation control signal in response to a data input signal, a data output signal, the row active signal and a row precharge signal.

2. The internal voltage generation control circuit as set forth in claim 1, the row active controller enabling the first internal voltage generation control signal when the row active signal is enabled upon input of an active command and then disabling the first internal voltage generation control signal after the lapse of a first internal voltage generation control signal after the lapse of a first predetermined delay time if the RAS activation guarantee signal is enabled at a RAS active time after the first internal voltage generation control signal is enabled.

3. The internal voltage generation control circuit as set forth in claim 1, the input/output controller enabling the second internal voltage generation control signal when the row active signal and at least one of the data input signal and data output signal are enabled and then disabling the second internal voltage generation control signal after the lapse of a second predetermined delay time if the row precharge signal is enabled or if the data input signal and data output signal are disabled.

4. The internal voltage generation control circuit as set forth in claim 1, further comprising a row precharge controller for outputting a third internal voltage generation control signal in response to the row precharge signal, the row precharge controller enabling the third internal voltage generation control signal for a third predetermined delay time if the row precharge signal is enabled.

5. The internal voltage generation control circuit as set forth in claim 4, further comprising a logic circuit for performing a logical operation with respect to the first to third internal voltage generation control signals to output a target internal voltage generation control signal.

6. The internal voltage generation control circuit as set forth in claim 5, wherein the logic circuit is adapted to perform logical sum operation with respect to the first to third internal voltage generation control signals.

7. The internal voltage generation control circuit as set forth in claim 4, wherein the row active controller includes:
  a pull-down device for pulling a control node down in response to the row active signal;
  a pull-up device for pulling the control node up in response to the RAS activation guarantee signal;
  a latch for latching a signal at the control node; and
  a delay operated in response to an output signal from the latch, the delay enabling and outputting the first internal voltage generation control signal when the row active signal is enabled and then disabling and outputting the first internal voltage generation control signal after the lapse of the first predetermined delay time if the RAS activation guarantee signal is enabled.

8. The internal voltage generation control circuit as set forth in claim 7, wherein the delay includes:
  a delay element for delaying the output signal from the latch for the first predetermined delay time; and
  a logic unit for performing a logical operation with respect to the output signal form the latch and an output signal from the delay element to output the first internal voltage generation control signal.

9. The internal voltage generation control circuit as set forth in claim 4, wherein the input/output controller includes:
  a first logic unit for performing a logical operation with respect to the data input signal and the data output signal;
  a pull-down device for pulling a control node down in response to the row active signal;
  a pull-up device for pulling the control node up in response to the row precharge signal;
  a latch for latching a signal at the control node;
  a second logic unit for performing a logical operation with respect to an output signal from the first logic unit and an output signal form the latch; and
  a delay for enabling the second internal voltage generation control signal when an output signal from the second logic unit is enabled and disabling the second internal voltage generation control signal after the lapse of the second predetermined delay time if the output signal from the second logic unit is disabled.

10. The internal voltage generation control circuit as set forth in claim 9, wherein the delay includes:
  a buffer for buffering the output signal from the second logic unit;
  a delay element for delaying an output signal form the buffer for the second predetermined delay time; and
  a third logic unit for performing a logical operation with respect to the output signal from the buffer and an output signal from the delay element to output the second internal voltage generation control signal.

11. The internal voltage generation control circuit as set forth in claim 9, wherein the first logic unit is adapted to perform a logical sum operation with respect to the input signal and the data output signal.

12. The internal voltage generation control circuit as set forth in claim 9, wherein the second logic unit is adapted to perform a logical product operation with respect to the output signal from the first logic unit and the output signal form the latch.

13. The internal voltage generation control circuit as set forth in claim 4, wherein the first predetermined delay time is a time required for an internal voltage to be stabilized after the RAS activation guarantee signal is enabled.

14. The internal voltage generation control circuit as set forth in claim 4, wherein the second predetermined delay time is a time required for completion of data input or data output.

15. The internal voltage generation control circuit as set forth in claim 4, wherein the third predetermined delay time includes at least the time from the start of a row precharge operation until the completion of the row precharge operation.

* * * * *

UNITED STATES PATENT AND TRADEMARK OFFICE
CERTIFICATE OF CORRECTION

PATENT NO. : 7,471,578 B2  Page 1 of 1
APPLICATION NO. : 11/739684
DATED : December 30, 2008
INVENTOR(S) : Sang Hee Kang It is certified that error appears in the above-identified patent and that said Letters Patent is hereby corrected as shown below:

At Column 13, line 40, "form" should be -- from --.

At Column 14, line 8, "form" should be -- from --.

At Column 14, line 19, "form" should be -- from --.

At Column 14, line 32, "form" should be -- from --.

Signed and Sealed this

Ninth Day of June, 2009

JOHN DOLL
*Acting Director of the United States Patent and Trademark Office*